(12) United States Patent
Chatty et al.

(10) Patent No.: US 8,084,822 B2
(45) Date of Patent: Dec. 27, 2011

(54) ENHANCED STRESS-RETENTION FIN-FET DEVICES AND METHODS OF FABRICATING ENHANCED STRESS RETENTION FIN-FET DEVICES

(75) Inventors: Kiran V. Chatty, Essex Junction, VT (US); Robert J. Gauthier, Jr., Essex Junction, VT (US); Jed Hickory Rankin, Essex Junction, VT (US); Robert R. Robison, Essex Junction, VT (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 12/570,384

(22) Filed: Sep. 30, 2009

(65) Prior Publication Data

US 2011/0073951 A1    Mar. 31, 2011

(51) Int. Cl.
*H01L 29/66*    (2006.01)
(52) U.S. Cl. ......... 257/365; 257/E29.264; 257/E21.421; 438/283
(58) Field of Classification Search .................. 257/365, 257/E21.421, E29.264; 438/283
See application file for complete search history.

(56) References Cited

U.S. PATENT DOCUMENTS

| | | | |
|---|---|---|---|
| 5,442,223 A | 8/1995 | Fujii | |
| 6,566,712 B2 | 5/2003 | Hayashi et al. | |
| 6,621,131 B2 | 9/2003 | Murthy et al. | |
| 6,707,106 B1 | 3/2004 | Wristers et al. | |
| 6,717,216 B1 | 4/2004 | Doris et al. | |
| 6,917,078 B2 | 7/2005 | Bhattacharyya | |
| 7,276,406 B2 | 10/2007 | Chen et al. | |
| 7,504,678 B2* | 3/2009 | Chau et al. | 257/287 |
| 7,547,637 B2* | 6/2009 | Brask et al. | 438/717 |
| 2004/0070312 A1 | 4/2004 | Penunuri et al. | |
| 2004/0256647 A1* | 12/2004 | Lee et al. | 257/289 |
| 2005/0247986 A1 | 11/2005 | Ko et al. | |
| 2006/0189053 A1 | 8/2006 | Wang et al. | |
| 2011/0079859 A1* | 4/2011 | Oh et al. | 257/401 |
| 2011/0180851 A1* | 7/2011 | Doyle et al. | 257/192 |

OTHER PUBLICATIONS

Notice of Allowance (Mail Date Feb. 5, 2010) for U.S. Appl. No. 12/116,237, filed May 7, 2008; Confirmation No. 6682.
G.Lehmann, et al, Young's Modulus and Density of Nanocrystalline Cubic Boron Nitride Films Determined by Dispersion of Surface Acoustic Waves, Applied Physics A 74, pp. 41-45, 2002.
G. Este, et al, Stress Control in Reactively Sputtered AlN and TIN Films, J. Vac. Sci. Technol., A 5, (4) pp. 1892-1897, Jul./Aug. 1987.

\* cited by examiner

*Primary Examiner* — Trung Q Dang
(74) *Attorney, Agent, or Firm* — Schmeiser, Olsen & Watts; David A. Cain

(57) ABSTRACT

Fin-FETS and methods of fabricating fin-FETs. The methods include: providing substrate comprising a silicon oxide layer on a top surface of a semiconductor substrate, a stiffening layer on a top surface of the silicon oxide layer, and a single crystal silicon layer on a top surface of the stiffening layer; forming a fin from the single crystal silicon layer; forming a source and a drain in the fin and on opposite sides of a channel region of the fin; forming a gate dielectric layer on at least one surface of the fin in the channel region; and forming a gate electrode on the gate dielectric layer.

22 Claims, 8 Drawing Sheets

US 8,084,822 B2

ENHANCED STRESS-RETENTION FIN-FET DEVICES AND METHODS OF FABRICATING ENHANCED STRESS RETENTION FIN-FET DEVICES

FIELD OF THE INVENTION

The present invention relates to the field of semiconductor devices; more specifically, it relates to devices and methods of manufacturing fin-FET devices formed on silicon-on-insulator substrates, the fin-FET devices having enhanced ability to retain stress induced by the manufacturing process.

BACKGROUND OF THE INVENTION

There is an ongoing need in the industry to decrease the size of semiconductor devices such as fin-field effect transistors (fin-FETs) in order to increase performance (speed) and decrease power consumption. One method to increase speed is to adjust the strain (from either compressive stress or tensile stress) on the semiconductor portions of the fin-field effect transistor. While these provide benefits to transistor performance, an even greater speed increase for fin-FETs in future applications beyond that attainable today is still required. Accordingly, there exists a need in the art to overcome the deficiencies and limitations described hereinabove.

SUMMARY OF THE INVENTION

A first aspect of the present invention is a fin-FET, comprising: a silicon oxide layer on a top surface of a semiconductor substrate; a stiffening layer on a top surface of the silicon oxide layer; a single crystal silicon fin on a top surface of the stiffening layer; a source and a drain in the fin and on opposite sides of a channel region of the fin; a gate dielectric layer on at least one surface of the fin in the channel region; and a gate electrode on the gate dielectric layer.

A second aspect of the present invention is a method of fabricating a fin-FET, comprising: providing substrate comprising: a silicon oxide layer on a top surface of a semiconductor substrate, a stiffening layer on a top surface of the silicon oxide layer, and a single crystal silicon layer on a top surface of the stiffening layer; forming a fin from the single crystal silicon layer; forming a source and a drain in the fin and on opposite sides of a channel region of the fin; forming a gate dielectric layer on at least one surface of the fin in the channel region; and forming a gate electrode on the gate dielectric layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 5A are top views and FIGS. 1B through 5B are corresponding cross-sectional drawings illustrating fabrication of fin-FETs according to embodiments of the present invention;

DETAILED DESCRIPTION OF THE INVENTION

Young's modulus (E) is a measure of stiffness. It is also known as the Young modulus, modulus of elasticity, elastic modulus or tensile modulus (the bulk modulus and shear modulus are different types of elastic modulus). It is defined as the ratio, for small strains, of the rate of change of stress with strain. Stress is a measure of the average amount of force exerted per unit area. Stress is a measure of the intensity of the total internal forces acting within a body across imaginary internal surfaces, as a reaction to external applied forces and body forces. Strain is the geometrical expression of deformation caused by the action of stress on a physical body.

In n-channel fin-FETs (fin-NFETs), the mobility of the majority carriers, electrons, is greater (hole mobility is less) when the channel is in tensile stress in the direction of current flow In p-channel fin-FETs (fin-PFETs) the mobility of the majority carriers, holes, is greater than (electron mobility is less) when the channel region is in compressive stress in the direction of current flow. Increasing the mobility of majority carriers increase the performance of the device.

Figure 1A:
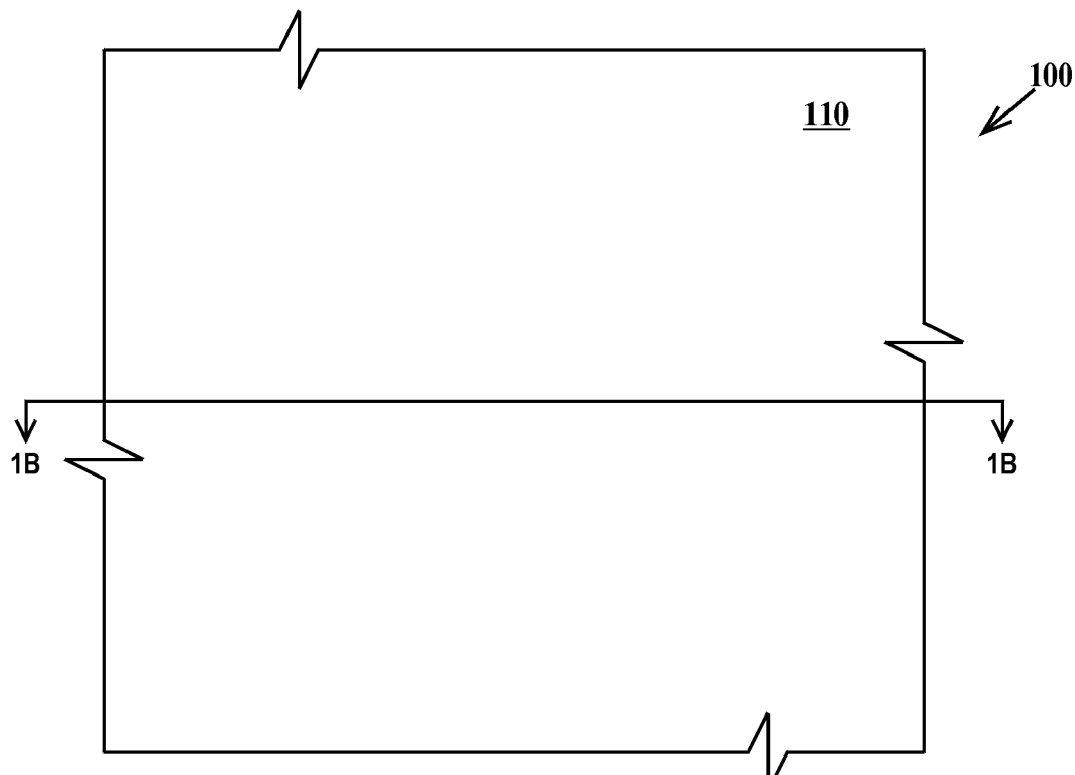
Figure 1B:
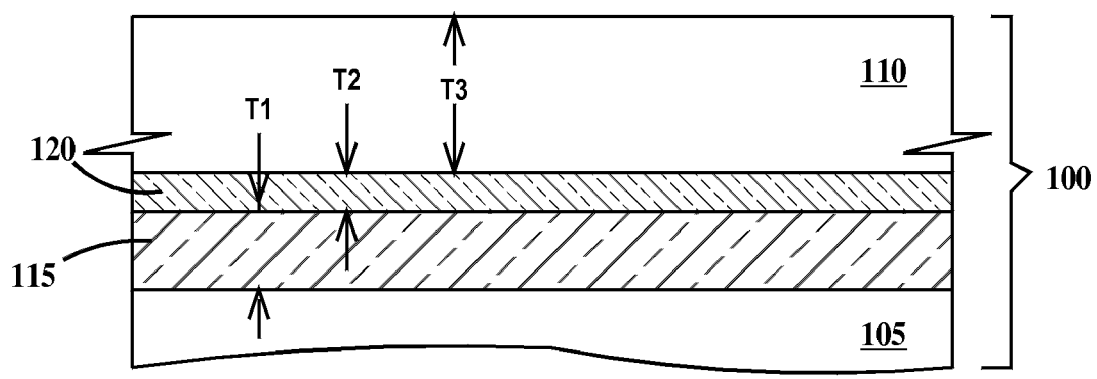

FIGS. 1A through 5A are top views and FIGS. 1B through 5B are corresponding cross-sectional drawings illustrating fabrication of fin-FETs according to embodiments of the present invention. In FIGS. 1A and 1B, a silicon-on-insulator (SOI) substrate 100 includes a base semiconductor substrate 105 and a single-crystal silicon layer 110 separated by an optional buried oxide (BOX layer) 115 and a dielectric stiffening layer 120. In the example of FIG. 1A, silicon layer 110 is directly on stiffening layer 120, stiffening layer 120 is directly on BOX layer 115 and BOX layer 115 is directly on base substrate 105. However, there may be a thin (less than about 3 nm thick) interface film(s) between BOX layer 115 and stiffening layer 120 caused by the fabrication process. For example the interface film may comprise silicon oxide or silicon oxynitride or both when stiffening layer 120 is silicon nitride and the BOX layer silicon oxide. In one example, stiffening layer 120 has a Young's modulus greater than that of silicon oxide and particularly greater than BOX layer 115. The Young's modulus for silicon dioxide is between about 46 GPa (giga-Pascals) and about 75 GPa. In one example, stiffening layer 120 has a Young's modulus greater than about 168 GPa. In one example, stiffening layer 120 is in neutral stress. In one example, the stress in stiffening layer 120 is between −200 MPa (mega-Pascals) compressive stress and 200 MPa tensile stress. If fin-PFETs are to be formed from silicon layer 110 it is advantageous that the internal stress in stiffening layer 120 be neutral or slightly tensile (i.e., between about 0 MPa and about 200 MPa). If fin-NFETs are to be formed from silicon layer 110 it is advantageous that the internal stress in stiffening layer 120 be neutral or slightly compressive (i.e., between about 0 MPa and about −200 MPa).

In one example, base substrate 105 is silicon. In one example, BOX layer 115 is silicon dioxide. In one example, BOX layer 115 is silicon dioxide and has a thickness of T1 where T1 is between about 100 nm and about 300 nm thick. In one example, stiffening layer 120 is silicon nitride. In one example, stiffening layer 120 has a thickness of T2 where T2 is between about 10 and 30 nm thick. In one example, silicon layer 110 has a thickness T3 where T3 is between about 50 nm and about 150 nm thick. If PFETs are to be formed in silicon layer 110, it is advantageous that silicon layer 110 be doped N-type. If fin-NFETs are to be formed from silicon layer 110, it is advantageous that silicon layer 110 be doped P-type.

It is advantageous that no silicon oxide layer intervene between silicon layer 110 and stiffening layer 120, because silicon oxide, having a Young's modulus less than that of silicon will negate the stiffening effect of stiffening layer 120. In one example, there are no intervening layers between silicon layer 110 and stiffening layer 120. In one example, there are no silicon oxide layers intervening layers between silicon layer 110 and stiffening layer 120. In one example, there are no silicon oxide layers greater than about 5 Å intervening between silicon layer 110 and stiffening layer 120. (Native oxide films of about 5 Å will not adversely effect the invention, though such films can be removed and re-growth prevented.) In one example, there are no layers intervening layers between silicon layer 110 and stiffening layer 120 having a Young's modulus less than about 168 GPa. In one example, stiffening layer 120 is formed directly on base semiconductor substrate 105.

Figure 2A:
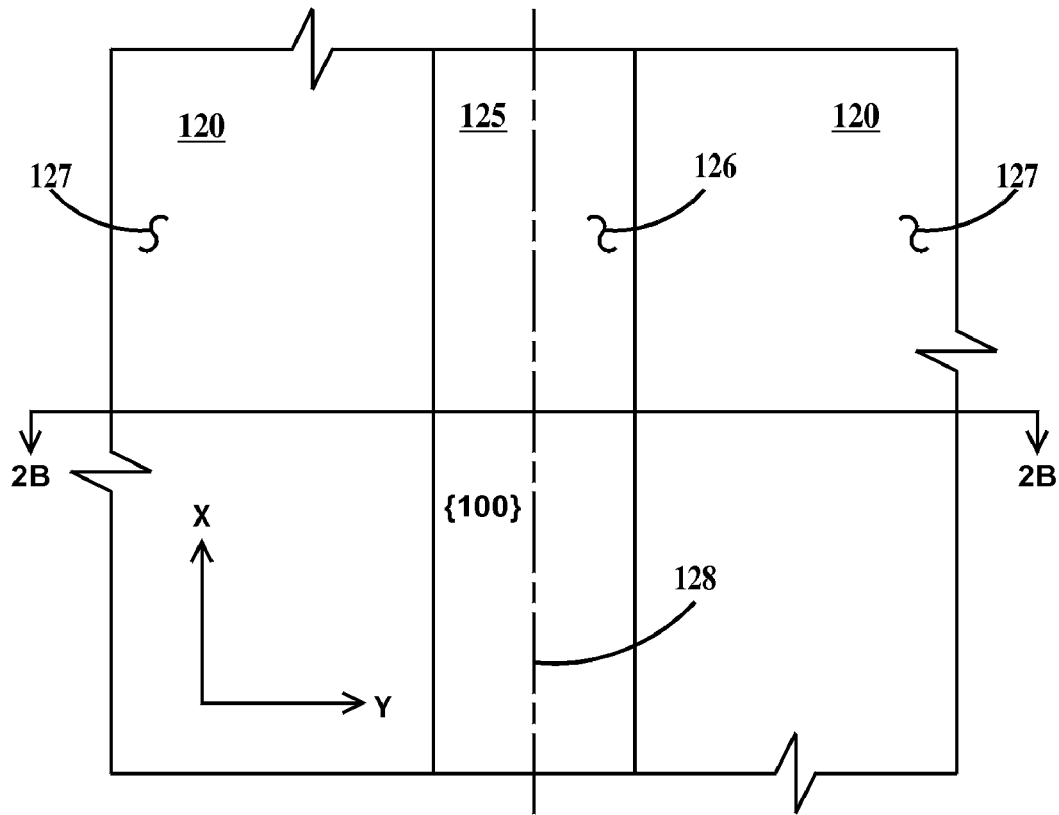
Figure 2B:
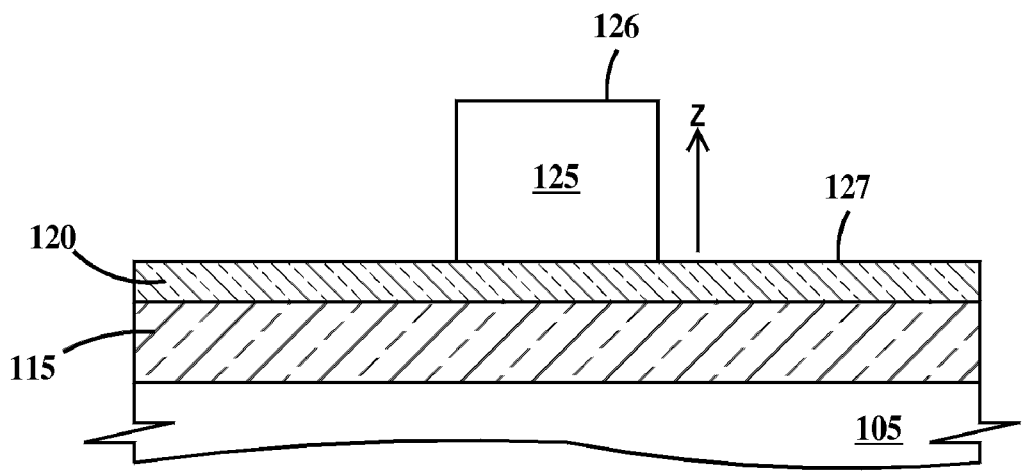

In FIGS. 2A and 2B, a silicon fin 125 has been formed by removing regions of silicon layer 110 (see FIGS. 1A and 1B) using, for example, a photolithographic process followed by an etch processes. In one example, a top surface 126 of fin 125 is parallel to a top surface 127 of stiffening layer 120 and defines a plane that X and Y directions are parallel to and a Z direction is perpendicular to. The X, Y and Z axes are mutually orthogonal and a longitudinal axes 128 of fin 125 is parallel to the X direction. In one example, the crystal orientation of top surface 126 of fin 125 is {100}. Other crystal orientations such as {110} and {111} are also possible. Note {100} includes (100), (010) and (001) and {110} includes (110) and (011) and (101). A height of 125 in the Z-direction may be less than, equal to or greater than a width of fin 125 in the Y-direction.

A photolithographic process is one in which a photoresist layer is applied to a surface of a layer, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch), the patterned photoresist is removed. The photoresist layer may optionally be baked at one or more the following steps: prior to exposure to actinic radiation, between exposure to actinic radiation and development, after development. The photoresist pattern is then transferred into the layer by etching (e.g. wet etching, RIE. etc). In the present example, the layer may be silicon layer 110 (see FIGS. 1A and 1B) or a hardmask layer formed on top of silicon layer 110. When a hardmask layer is used, after transferring the pattern from the photoresist layer to the hardmask layer (by etching), the undeveloped portion of the photoresist layer is removed the pattern transferred from the hardmask layer to silicon layer 110 (by etching) and then the hardmask layer may or may not be removed.

Figure 3A:
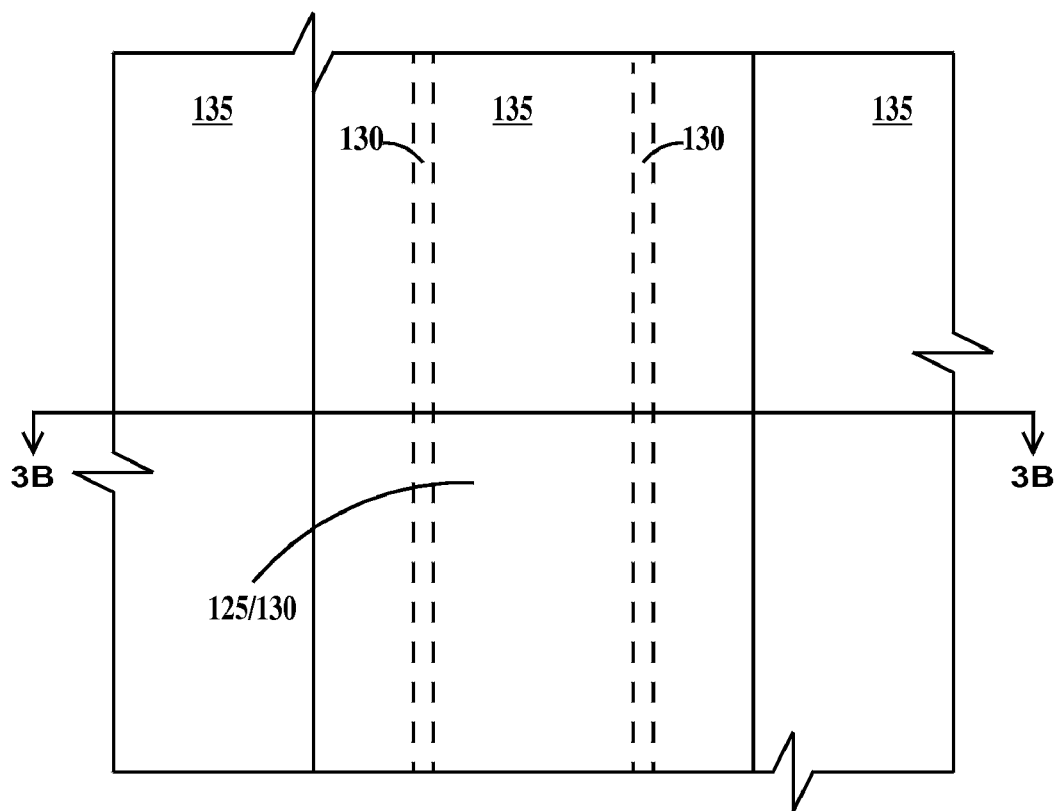
Figure 3B:
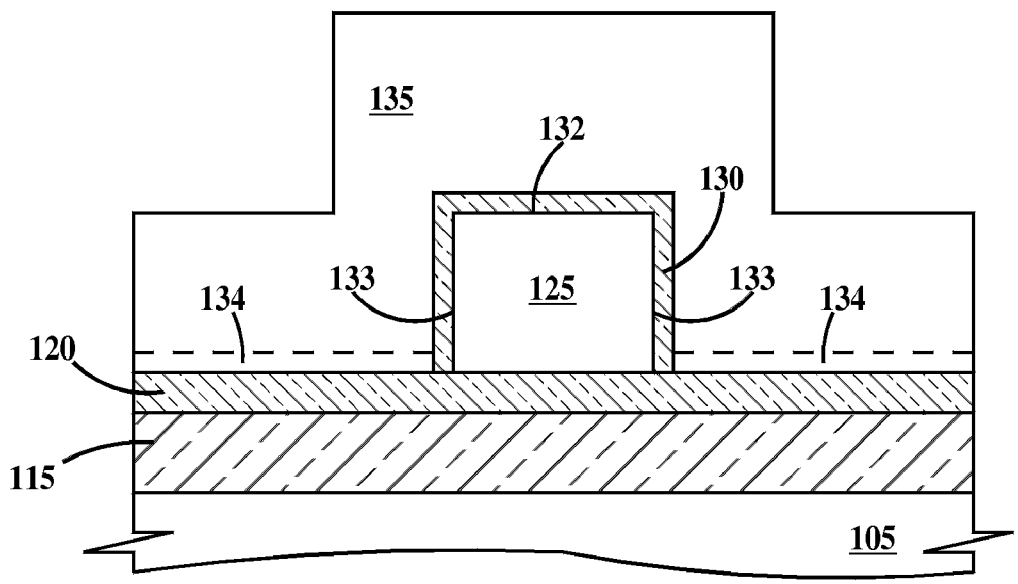

In FIGS. 3A and 3B, a gate dielectric layer 130 is formed on top surface 132 and sidewalls 133 of fin 125. In one example, gate dielectric layer 130 is formed by oxidation of exposed surfaces of fin 125. Alternatively, gate dielectric layer 130 may be formed by deposition so regions 134 of gate dielectric layer 130 are also formed on exposed surfaces of stiffening layer 120. Regions 134 of gate dielectric layer 130 are illustrated in FIG. 3B by the dashed lines. FIGS. 4A, 4B, 5A, 5B are illustrated using a dielectric layer formed by oxidation. After formation of gate dielectric layer 130, an electrically conductive gate layer 135 is blanket deposited over gate dielectric layer 130 and any exposed regions of stiffening layer 120. In one example, gate layer 135 is polysilicon and gate dielectric layer 130 is silicon oxide. In one example, gate layer 135 is a metal (e.g., Al, TiN, TaN). In one example gate dielectric layer 130 is a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10.

Figure 4A:
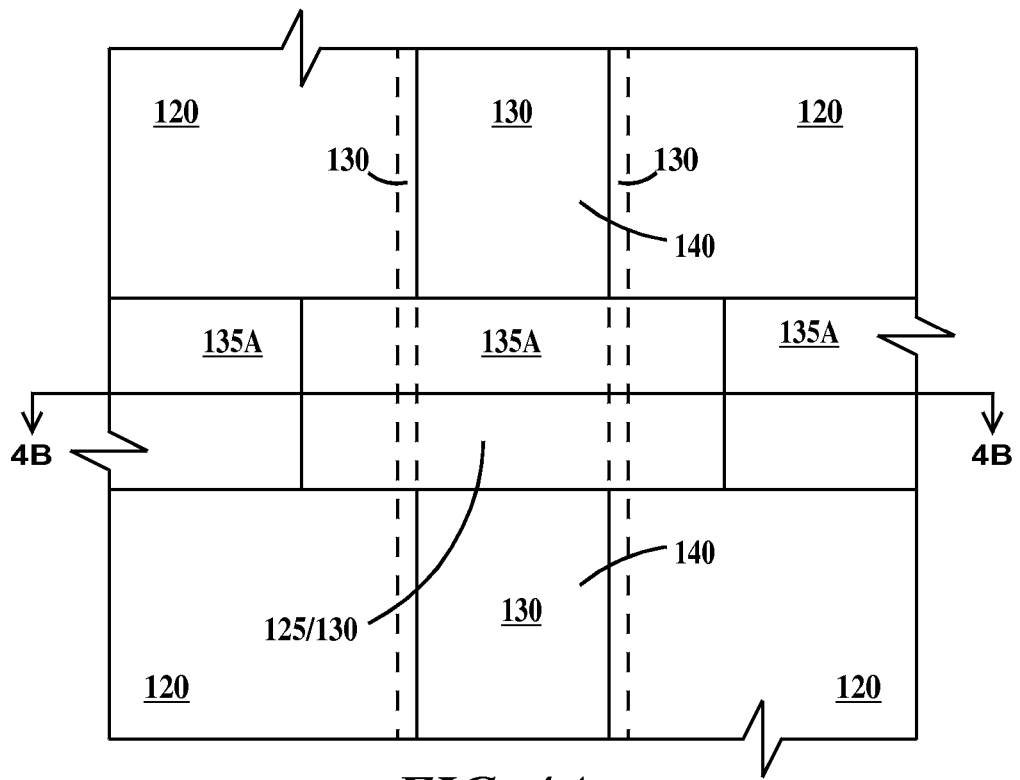
Figure 4B:
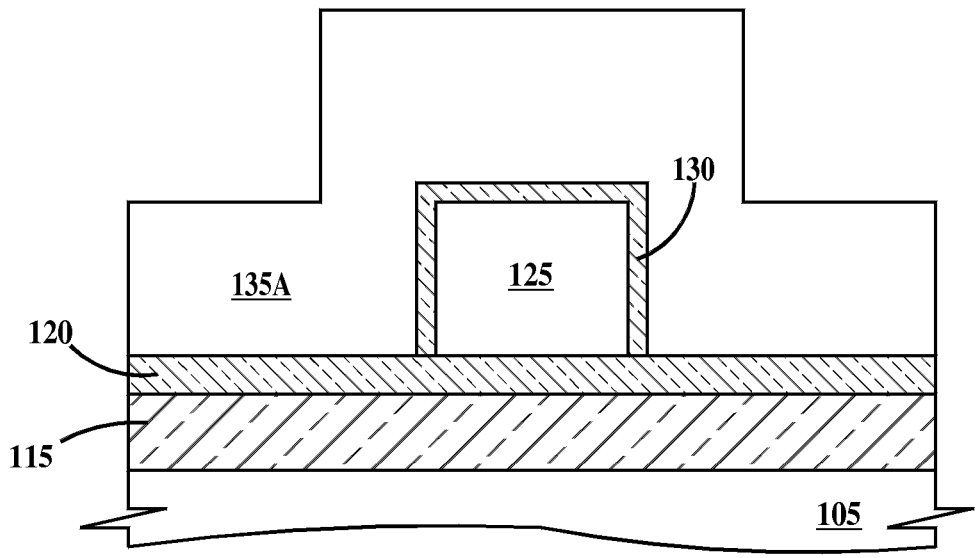

In FIGS. 4A and 4B polysilicon layer 135 (see FIGS. 3A and 3B) is photolithographically patterned and etched to form a gate electrode 135A. In the example of FIG. 4A, gate electrode is formed perpendicular to fin 125. Alternatively, gate electrode 135A may be formed at an angle of other than 90° to fin 125. After formation of gate electrode 135A, source drains 140 are formed in fin 125 for example, by one or more ion implantations using gate electrode 135A as an ion implantation mask. For a fin-PFET the net doping of source/drains 140 is P type and for a fin-NFET the net doping of source/drains 140 is N-type. The region of fin 125 under gate electrode 135A will be the channel region of a fin-FET when fabrication of the fin-FET is completed.

Figure 5A:
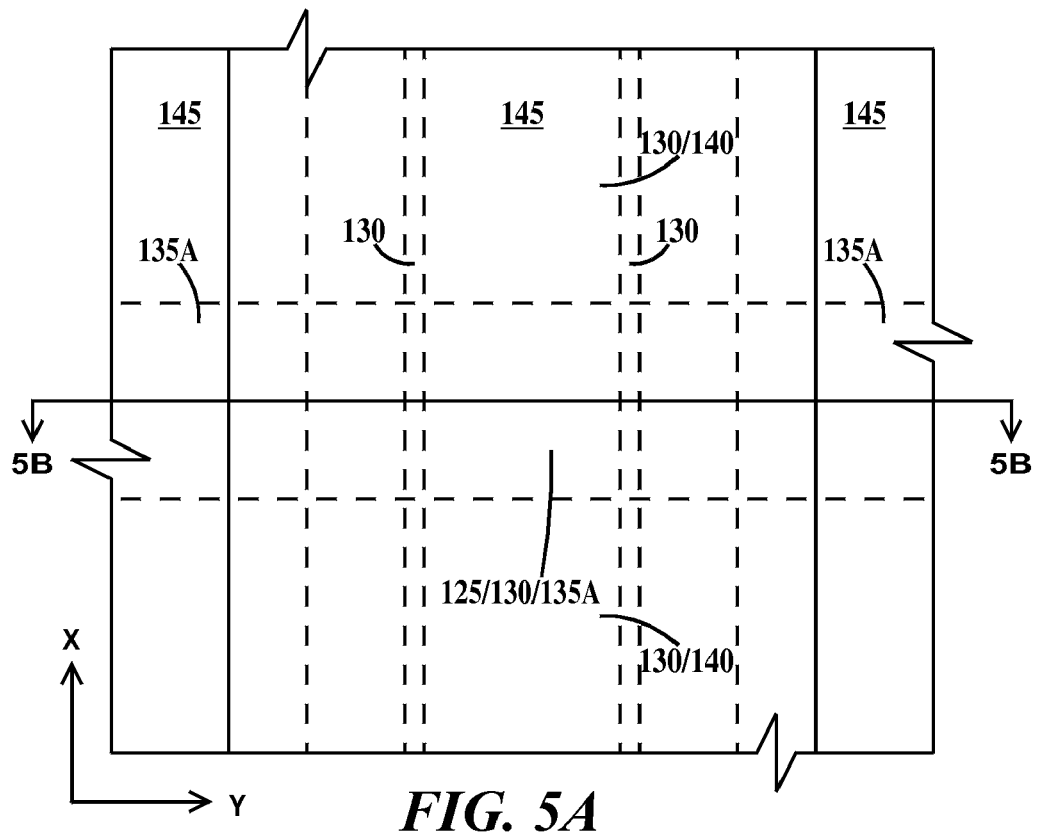
Figure 5B:
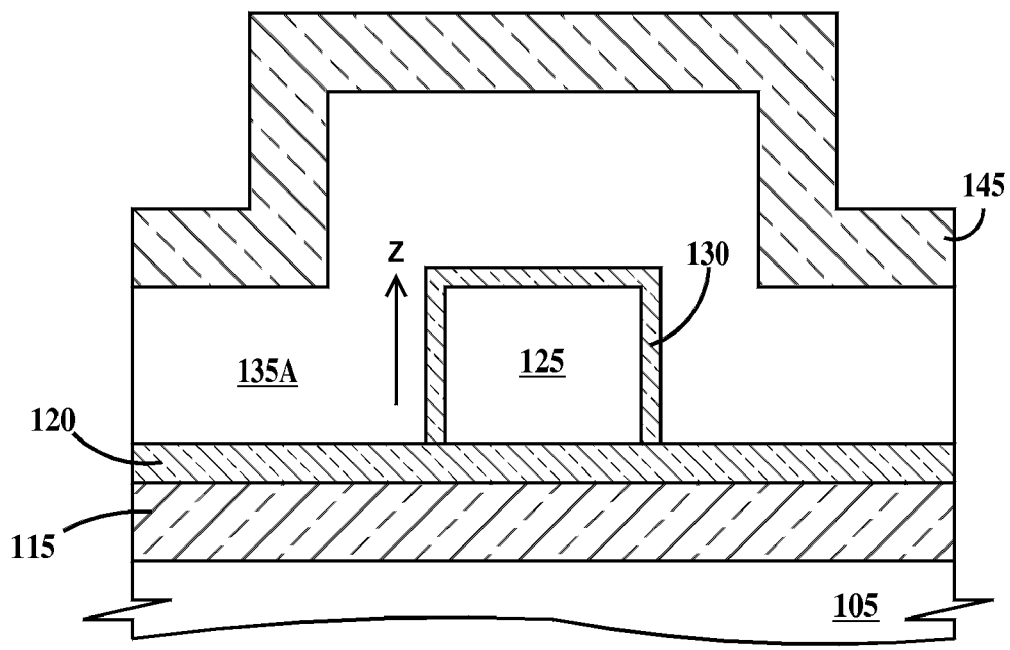

In FIGS. 5A and 5B, a dielectric stress layer 145 is formed over exposed surfaces of stiffening layer 120, gate dielectric 130 and gate electrode 135A. For a fin-PFET, stress layer 145 is in compressive stress. In one example, for a fin-PFET, stress layer 145 comprises internally compressive stressed silicon nitride. For a fin-NFET, stress layer 145 is in tensile stress. In one example, for a fin-NFET, stress layer 145 comprises internally tensile stressed silicon nitride.

Alternatively gate electrode 135A may act as a stress layer in which case stress layer 145 of FIGS. 5A and 5B (and 5C and 5D described infra) are optional. For a fin-PFET, gate electrode 135A is in compressive stress. In one example, for a fin-PFET, gate electrode 135A comprises internally compressive stressed polysilicon. For a fin-NFET, gate electrode 135A is in tensile stress. In one example, for a fin-NFET, gate electrode 135A comprises internally tensile stressed polysilicon. Thus stress may be introduced into channel region 120 by (i) gate electrode 135A only (there being no stress layer), (ii) stress layer 145 only or (iii) a combination of gate electrode 135A and stress layer 145.

Stress simulations were performed for a simulated fin-PFET having the structure of FIGS. 5A and 5B. In the X direction (from source to drain and parallel to the top surface of the silicon layer) tensile stress in the channel region increased by about 2% with the stiffening layer versus without the stiffening layer and the stress was about 0 MPa to about 50 MPa with the stiffening layer. In the Y direction tensile stress in the channel region increased by about 2% with the stiffening layer versus without the stiffening layer and the stress was about 100 MPa to about 300 MPa with the stiffening layer. In the Z direction compressive stress in the channel region increased by about 5% with the stiffening layer versus without the stiffening layer and the stress was about 500 MPa to about 900 MPa with the stiffening layer.

Figure 2C:
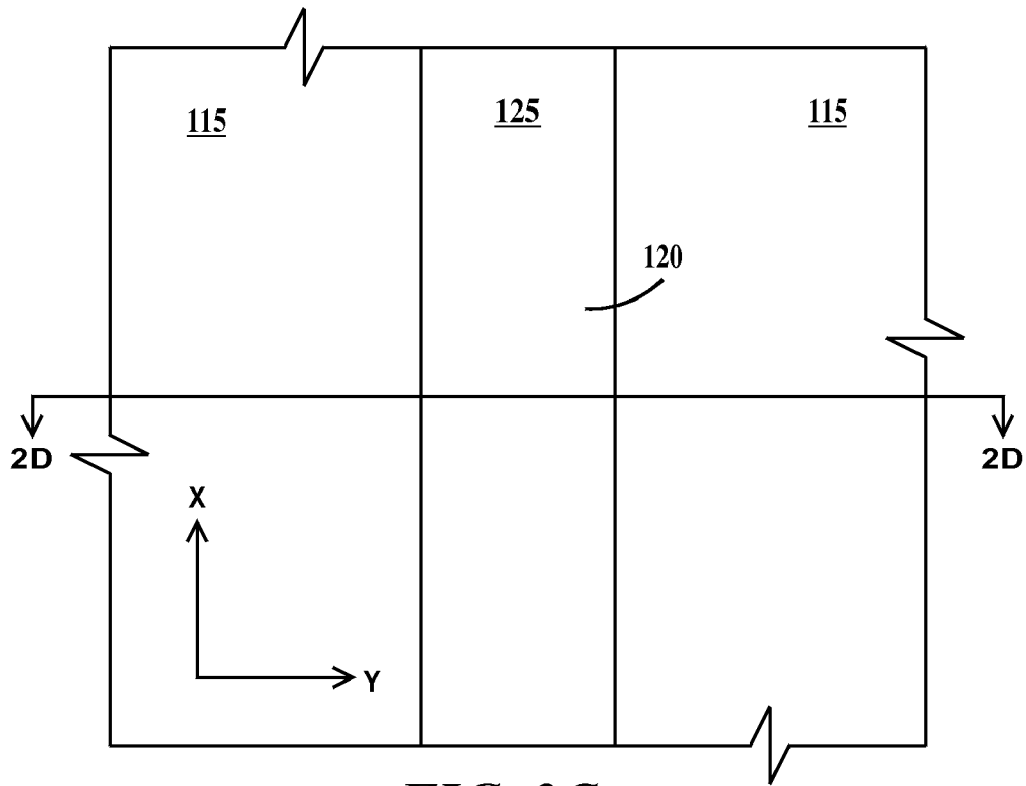
FIGS. 2C and 5C are top views and FIGS. 2D and 5D are corresponding cross-sectional drawings illustrating fabrication of fin-FETs illustrating alternate fabrication steps according to embodiments of the present invention.
Figure 2D:
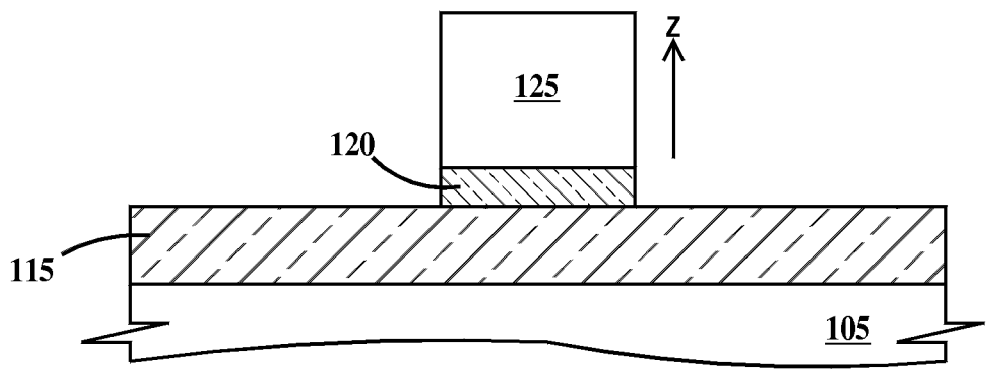
Figure 5C:
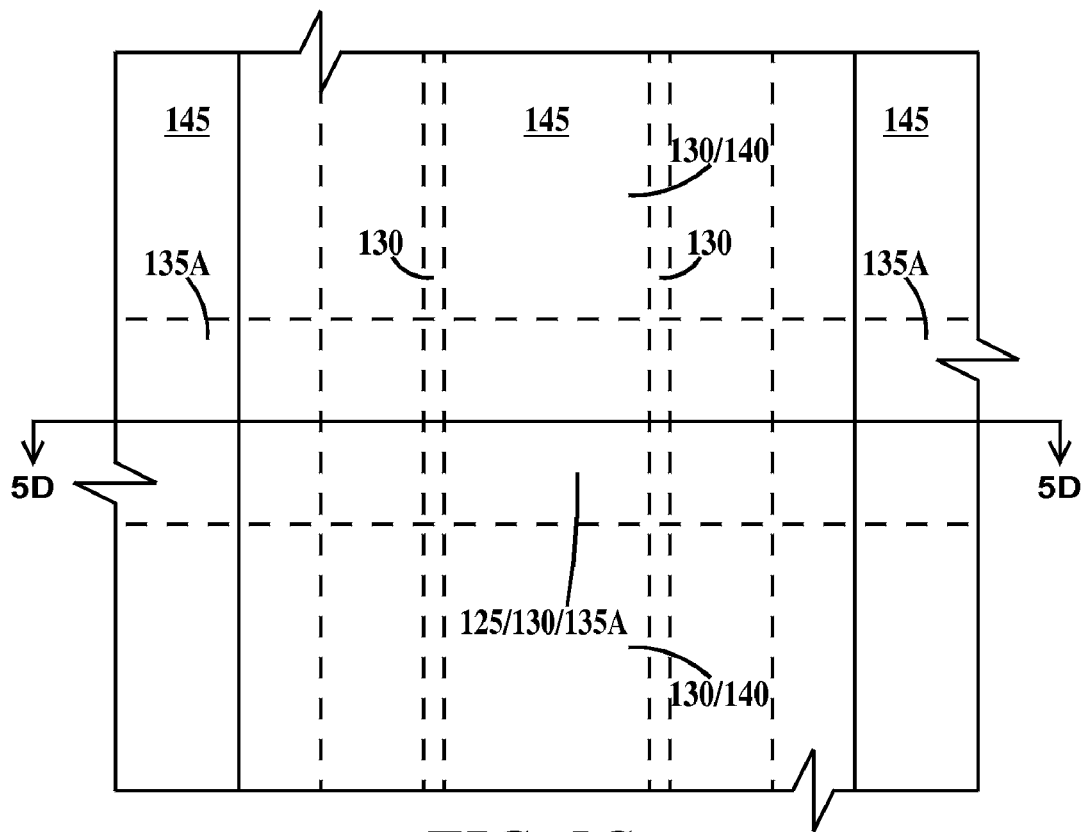
Figure 5D:
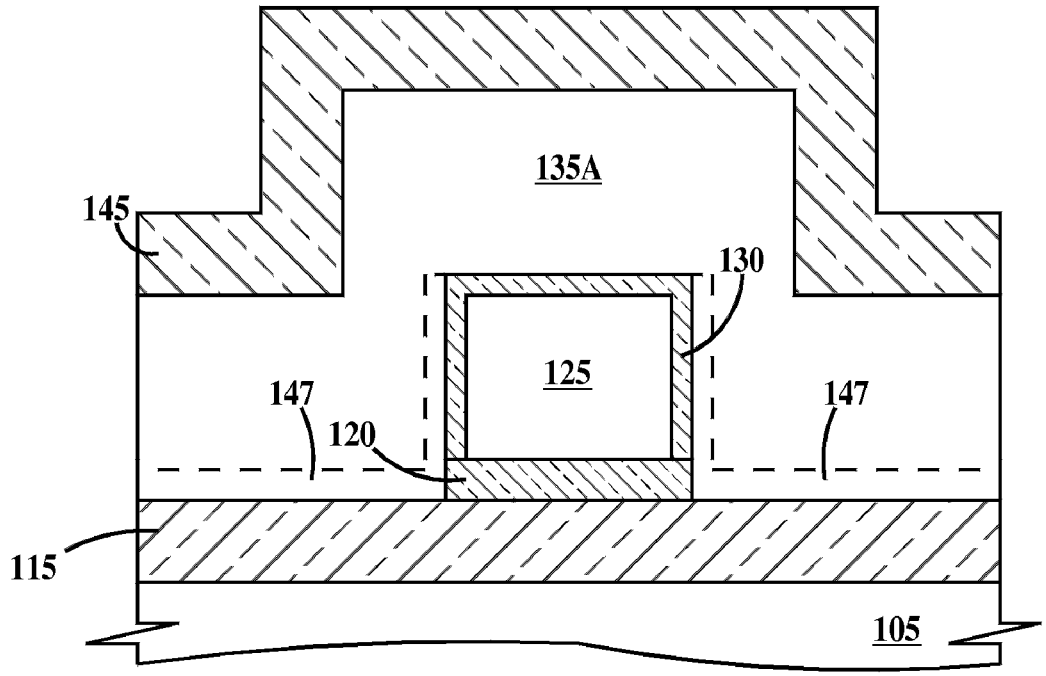

FIGS. 2C and 5C are top views and FIGS. 2D and 5D are corresponding cross-sectional drawings illustrating fabrication of fin-FETs illustrating alternate fabrication steps according to embodiments of the present invention. FIGS. 2C and 2D are similar to and replace respective FIGS. 2A and 2B in the fabrication sequence just presented. In FIG. 2D it can be seen that stiffening layer 120 has been removed except for directly under fin 125. In FIG. 2D, stiffening layer 120 does not extend past the perimeter of fin 125. This may be accomplished by etching stiffening layer 120 using fin 125 as an etch mask or by simply extending the length of the etch time of the etch used to etch silicon layer 110 (see FIGS. 1A and 1B). In either case, the etch chemistry (wet or RIE) may be changed to reflect the chemical differences between silicon layer 110 and stiffening layer 120.

After performing the processes described supra with respect to FIGS. 3A, 3B, 4A and 4B, the structures illustrated in FIGS. 5C and 5D will result. The major difference between FIGS. 5C and 5D and 5A and 5B is that stiffening layer 120 does not extend past the perimeter of fin 125 in FIGS. 5C and 5D but does extend past the perimeter of fin 125 in FIGS. 5A and 5B. In FIGS. 5C and 5D gate dielectric layer 130 is illustrated as having been formed by oxidation of exposed surfaces of fin 125. Alternatively, gate dielectric layer 130 may be formed by deposition so regions 147 of gate dielectric layer 130 are also formed on exposed surfaces of BOX layer 115. Regions 147 of gate dielectric layer 130 are illustrated in FIG. 5D by the dashed lines.

Figure 6A:
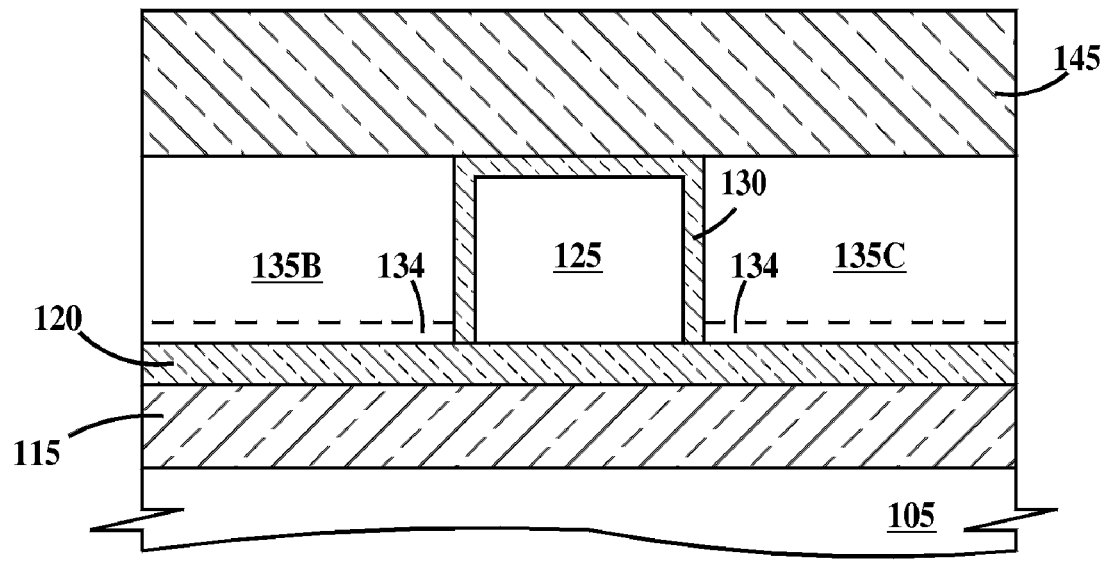
FIGS. 6A and 6B are cross-section through dual gated fin-FETs according to embodiments of the present invention.
Figure 6B:
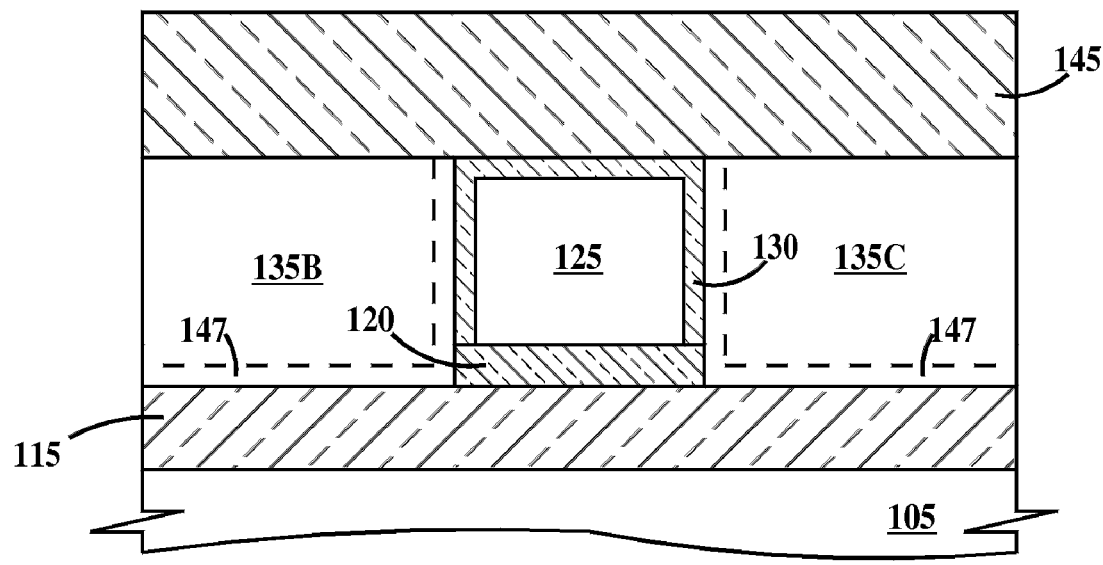

FIGS. 6A and 6B are cross-section through dual gated fin-FETs according to embodiments of the present invention. If between the fabrication steps illustrated in FIGS. 4A and 4B and those illustrated in FIGS. 5A and 5B, a chemical-mechanical-polish (CMP) is performed on gate electrode 135A (see FIGS. 4A and 4B) to remove those regions of gate electrode 135A over the top surface of fin 125, a dual gated fin-FET will be formed after performing the fabrication steps described supra in reference to FIGS. 5A and 5B. Thus in FIGS. 6A and 6B a first gate electrode 135B is formed on that portion of gate dielectric layer 130 on a first side of fin 125 and a second gate electrode 135C is formed on that portion of gate dielectric layer 130 on a second and opposite side of fin 125. The major differences between FIGS. 6A and 6B is that stiffening layer 120 does not extend past the perimeter of fin 125 in FIG. 6B but does in FIG. 6A. In FIGS. 6A and 6B gate dielectric layer 130 has been formed by oxidation of exposed surfaces of fin 125. Alternatively, gate dielectric layer 130 may be formed by deposition so regions 134 (FIG. 6A) and 147 (FIG. 6B) of gate dielectric layer 130 are also formed on exposed surfaces of BOX layer 115. Regions 134 and 147 of gate dielectric layer 130 are illustrated in FIGS. 6A and 6B by the dashed lines.

In all of the embodiments of the present invention, after or before formation of stiffening layer 145 (see FIGS. 5A and 5B), electrically conductive metal silicide contacts may be formed to the source/drains 140 (see FIGS. 5A and 5B) and gate electrode 135A (see FIGS. 5A and 5B) or gate electrodes 135B and 135C (see FIGS. 6A and 6B). A metal silicide contacts is a thin region of silicon proximate to the top surface of a silicon layer that has been converted to a metal silicide by thermal reaction with a metal layer deposited on the silicon layer. After formation of stiffening layer 145 (see FIGS. 5A and 5B) contact openings to the metal silicide contacts are formed and the contact opening filled with an electrically conductive material (e.g., a metal).

Thus the embodiments of the present invention overcome the limitations of the art and provide fin-FETs and methods of fabrication of strained fin-FETs in silicon-on-insulator technology having enhanced stress retention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A fin-FET, comprising:
   a silicon oxide layer on a top surface of a semiconductor substrate;
   a stiffening layer on a top surface of said silicon oxide layer;
   a single crystal silicon fin on a top surface of said stiffening layer;
   a source and a drain in said fin and on opposite sides of a channel region of said fin;
   a gate dielectric layer on at least one surface of said fin in said channel region; and
   a gate electrode on said gate dielectric layer.
2. The fin-FET of claim 1, wherein said stiffening layer has a Young's modulus greater than that of said silicon oxide layer.
3. The fin-FET of claim 1, wherein said stiffening layer has a Young's modulus greater than 168 GPa.
4. The finFET of claim 1, wherein said stiffening layer is in neutral stress or in a stress between about −200 MPa and about 200 MPa.
5. The fin-FET of claim 1, further including:
   a stress layer formed over said source, said drain and said gate electrode, said stress layer (i) being in compressive stress if said source and drain are doped P-type and said channel region is doped N-type or (ii) being in tensile stress if said source and drain are doped N-type and said channel region is doped P-type.
6. The fin-FET of claim 1, wherein said stiffening layer does not extend past a perimeter of said silicon fin.
7. The fin-FET of claim 1, wherein said stiffening layer extends past a perimeter of said silicon fin.
8. The fin-FET of claim 1, wherein said gate dielectric layer is formed on a top surface and opposite sidewalls of said silicon fin in said channel region and said gate electrode is formed on said gate dielectric layer over said top surface and said opposite sidewalls of said silicon fin in said channel region.
9. The fin-FET of claim 1, wherein said gate dielectric layer is formed on opposite first and second sidewalls of said silicon fin in said channel region and said gate electrode is formed on said gate dielectric layer on said first sidewall and an additional gate electrode formed on said gate dielectric layer on said second sidewall.
10. The method of claim 1, further including:
    said gate electrode (i) being in compressive stress if said source and drain are doped P-type and said channel region is doped N-type or (ii) being in tensile stress if said source and drain are doped N-type and said channel region is doped P-type.
11. A method of fabricating a fin-FET, comprising:
    providing substrate comprising: a silicon oxide layer on a top surface of a semiconductor substrate, a stiffening layer on a top surface of said silicon oxide layer, and a single crystal silicon layer on a top surface of said stiffening layer;
    forming a fin from said single crystal silicon layer;
    forming a source and a drain in said fin and on opposite sides of a channel region of said fin;
    forming a gate dielectric layer on at least one surface of said fin in said channel region; and
    forming a gate electrode on said gate dielectric layer.

12. The method of claim 11, wherein said stiffening layer has a Young's modulus greater than that of said silicon oxide layer.

13. The method of claim 11, wherein said stiffening layer has a Young's modulus greater than 168 GPa.

14. The finFET of claim 11, wherein said stiffening layer is in neutral stress or in a stress between about −200 MPa and about 200 MPa.

15. The method of claim 11, further including:
forming a stress layer over said source, said drain and said gate electrode, said stress layer (i) being in compressive stress if said source and drain are doped P-type and said channel region is doped N-type or (ii) being in tensile stress if said source and drain are doped N-type and said channel region is doped P-type.

16. The method of claim 11, wherein said stiffening layer does not extend past a perimeter of said silicon fin.

17. The method of claim 11, wherein said stiffening layer extends past a perimeter of said silicon fin.

18. The method of claim 11, wherein said gate dielectric layer is formed on a top surface and opposite sidewalls of said silicon fin in said channel region and said gate electrode is formed on said gate dielectric layer over said top surface and said opposite sidewalls of said silicon fin in said channel region.

19. The method of claim 11, wherein said gate dielectric layer is formed on opposite first and second sidewalls of said silicon fin in said channel region and said gate electrode is formed on said gate dielectric layer on said first sidewall and an additional gate electrode formed on said gate dielectric layer on said second sidewall.

20. The method of claim 11, wherein said gate dielectric layer is formed by oxidation of a top surface and opposite sidewalls of said fin.

21. The method of claim 11, wherein said gate dielectric layer is formed by deposition of dielectric material on a top surface and opposite sidewalls of said fin.

22. The method of claim 11, further including:
said gate electrode (i) being in compressive stress if said source and drain are doped P-type and said channel region is doped N-type or (ii) being in tensile stress if said source and drain are doped N-type and said channel region is doped P-type.

* * * * *